(12) United States Patent
Kosaka et al.

(10) Patent No.: US 8,440,538 B2
(45) Date of Patent: May 14, 2013

(54) METHOD OF MANUFACTURING AIRBRIDGE

(75) Inventors: Naoki Kosaka, Tokyo (JP); Ko Kanaya, Tokyo (JP); Yoshihiro Tsukahara, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 170 days.

(21) Appl. No.: 13/089,343

(22) Filed: Apr. 19, 2011

(65) Prior Publication Data

US 2012/0094481 A1   Apr. 19, 2012

(30) Foreign Application Priority Data

Oct. 15, 2010   (JP) .................. 2010-232129

(51) Int. Cl.
*H01L 21/311* (2006.01)
*H01L 21/76* (2006.01)

(52) U.S. Cl.
USPC ............... 438/411; 438/701; 257/E21.581; 174/261

(58) Field of Classification Search ........ 438/411, 438/701; 174/261; 257/E21.581
See application file for complete search history.

(56) References Cited

U.S. PATENT DOCUMENTS

| | | | |
|---|---|---|---|
| 5,268,315 A * | 12/1993 | Prasad et al. | 438/314 |
| 5,488,253 A * | 1/1996 | Matsuoka | 257/622 |
| 5,677,574 A | 10/1997 | Hisaka | |
| 5,686,743 A | 11/1997 | Lammert | |
| 5,698,462 A | 12/1997 | Sasaki | |
| 6,037,245 A | 3/2000 | Matsuda | |
| 7,812,451 B2 | 10/2010 | Asano | |
| 2005/0011673 A1 * | 1/2005 | Wong et al. | 174/261 |
| 2006/0017065 A1 * | 1/2006 | Kobayashi | 257/197 |
| 2010/0297552 A1 | 11/2010 | Otsuka | |

FOREIGN PATENT DOCUMENTS

| | | |
|---|---|---|
| JP | 61-194851 A | 8/1986 |
| JP | 3-105949 A | 5/1991 |
| JP | 6-89940 A | 3/1994 |
| JP | 8-8340 A | 1/1996 |
| JP | 8-107120 A | 4/1996 |
| JP | 8-288384 A | 11/1996 |
| JP | 10-65006 A | 3/1998 |
| JP | 2000-022131 B2 | 1/2000 |
| JP | 2008-270617 A | 11/2008 |
| JP | 2010-272802 A | 12/2010 |

* cited by examiner

*Primary Examiner* — Charles Garber
*Assistant Examiner* — Ron Pompey
(74) *Attorney, Agent, or Firm* — Leydig, Voit & Mayer, Ltd.

(57) ABSTRACT

In making an airbridge structure, a second resist layer is applied over a first resist layer. The resist layers are exposed and developed to have a predetermined width $W_2$. A third resist layer is applied. The third resist layer is also exposed and developed to have a predetermined width $W_3$. An airbridge-forming material layer is applied to the layer stack structure consisting of the first, second, and third resist layers, forming an airbridge. The resist layers are removed, completing the manufacture of the airbridge, which has a stepped cross section.

15 Claims, 6 Drawing Sheets

METHOD OF MANUFACTURING AIRBRIDGE

FIELD OF THE INVENTION

The present invention relates to a method of manufacturing an airbridge.

BACKGROUND ART

Airbridges of various shapes have been known, such as those disclosed, e.g., in Japanese Laid-Open Patent Publication Nos. H10-65006, H08-107120, 2008-270617, S61-194851, H08-288384, H08-8340, and H03-105949. An airbridge is typically a three-dimensional wiring structure formed on a substrate so as to use air between the structure and the substrate as an insulator. More specifically, it is a bridge-shaped wiring structure of conductive material formed on a substrate so as to straddle various components on the substrate, such as wiring conductors and semiconductor elements.

In the formation of an airbridge extending over components, the first step is to apply a layer of spacer material (e.g., a resist) over these components, as described, e.g., in the above Japanese Laid-Open Patent Publication No. S61-194851. The next step is to form a layer of airbridge-forming conductive material on this resist layer, followed by the step of removing the resist layer. Thus, the resist layer serves as a spacer for forming a space under the airbridge. As such, the shape and size of the resist layer determine the width of the airbridge, the distance spanned by the airbridge (or the length of the airbridge), and the height of the airbridge.

A typical cross-sectional shape of an airbridge is a rectangle (more specifically, a rectangular U-shape with its open ends facing the substrate), as is known in the art.

Further, for example, various U-shaped cross-sectional shapes of airbridges which include a curve have been proposed (i.e., these airbridges have a curved surface), as in the above Japanese Laid-Open Patent Publication Nos. H10-65006 and 2008-270617.

One advantage of the airbridge structure is that it protects from moisture the components (e.g., semiconductor active devices such as transistors) disposed below and covered by the airbridge. The area of the substrate surface located below and covered by the airbridge (which area may be referred to as the "coverage area") can be increased by increasing the width, or depth, of the airbridge (which herein refers to the dimension that is perpendicular to the height and the direction of the span of the airbridge). The greater the area of the substrate surface covered by the airbridge, the more protected the covered semiconductor active devices are from moisture.

However, simply increasing the width of a conventional rectangular airbridge (which requires a corresponding increase in the width of the airbridge-forming material layer) can cause a problem in its manufacturing process. Specifically, in the airbridge manufacturing process, a layer of airbridge-forming material is formed on a resist serving as a spacer, and then this resist is removed to produce the rectangular airbridge. However, resist material is likely to be left in the inner corners of the rectangular airbridge if the airbridge has an increased width (as compared to conventional constructions). The reason for this is that the resist must be formed along the increased width of the airbridge, making it difficult to remove the resist from between the airbridge and the substrate. One method for preventing such spacer material from being left in the corners of a rectangular airbridge is to increase the area of the opening under the airbridge (i.e., the area of the opening formed between the airbridge and the substrate). However, simply increasing the size of the rectangular airbridge to increase the area of this opening might result in a decrease in the strength of the airbridge.

Another method is to form an airbridge having curved surfaces, as is known in the art and described above. This prevents spacer material from being left in the inner corners of the airbridge, as well as avoiding a decrease in the strength of the airbridge. In practice, however, the formation of such airbridges requires a heating process to thermally deform the resist so that it has curved surfaces, as disclosed in the above Japanese Laid-Open Patent Publication No. H10-65006. This heat treatment adversely affects components around the airbridge. Specifically, heat from the heating process may cause a change in the transistor characteristics after they have been optimized in the transistor manufacturing process.

Thus it has been difficult, by conventional techniques, to manufacture an airbridge having a wide coverage area while conforming to various requirements as to the strength and other characteristics of the airbridge structure and as to the manufacturing process.

SUMMARY OF THE INVENTION

The present invention has been made to solve the above problems. It is, therefore, an object of the present invention to provide a method capable of manufacturing an airbridge having a wide coverage area while preventing reduction of the strength of the airbridge and degradation of the characteristics of the semiconductor elements covered by the airbridge and while avoiding the problem of spacer material being left in the inner corners of the airbridge.

According to a first aspect of the present invention, a method of manufacturing an airbridge includes following steps.

A first spacer providing step provides a first spacer layer on a substrate having a semiconductor element formed thereon so that the first spacer layer covers a component which are to be located below the airbridge and so that the first spacer layer has a width extending in the width direction of the airbridge and a first length extending in the length direction of the airbridge. The width direction is the direction in which the space under the airbridge extends. The first length direction is the direction in which the airbridge extends over and straddles the component to be located on the substrate below the airbridge.

A second spacer providing step provides a second spacer layer on the first spacer layer so that the first and second spacer layers form a layer stack structure having a step-like cross-sectional shape taken in a plane perpendicular to the width direction of the airbridge. The second spacer layer has a second length shorter than the first length of the first spacer layer.

An airbridge material layer forming step forms a material layer over the layer stack structure of the step-like cross-sectional shape without heat treatment for deforming the layer stack structure. The material layer is used to form the airbridge.

A spacer removing step removes, after the forming of the airbridge-forming material layer, the layer stack structure of the step-like cross-sectional shape.

Thus the present invention enables the manufacture of airbridges having a wide coverage area while preventing reduction of the strength of the airbridges and degradation of the characteristics of the semiconductor elements covered by the airbridges and while avoiding the problem of spacer material being left in the inner corners of the airbridges.

DETAILED DESCRIPTION OF THE PREFERRED EMBODIMENTS

First Embodiment
[Construction of First Embodiment]

Figure 1:
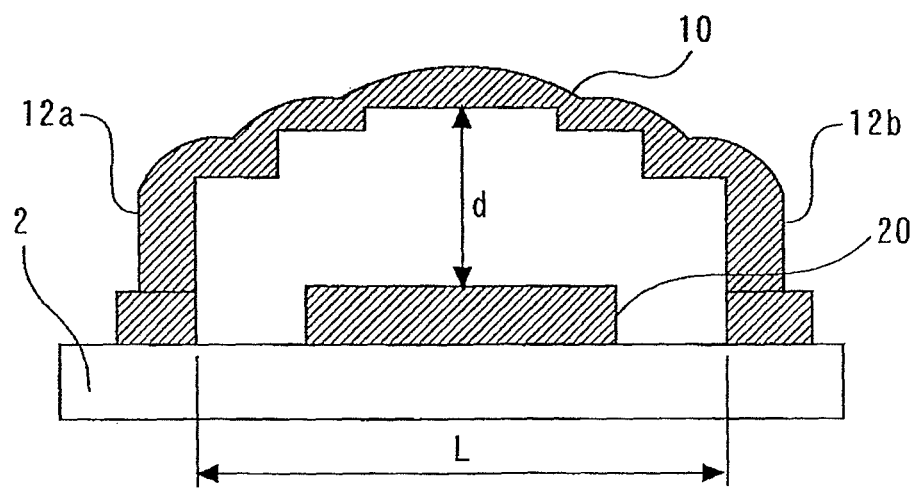
FIG. 1 is a diagram showing the construction of an airbridge in accordance with a first embodiment of the present invention.

FIG. 1 is a diagram showing the construction of an airbridge 10 in accordance with a first embodiment of the present invention. Specifically, FIG. 1 shows a cross-section of the airbridge 10 on a substrate 2, taken along a plane perpendicular to the substrate surface and parallel to the direction of the span of the airbridge. The airbridge 10 is symmetrical about the vertical centerline as viewed in FIG. 1. The airbridge 10 continuously extends in the direction perpendicular to the plane of the paper in FIG. 1 and has a uniform cross-section (identical to the cross-section shown in FIG. 1). In accordance with the first embodiment, the airbridge 10 is made of an airbridge-forming conductive material, namely, Au (gold).

As schematically shown in FIG. 1, a transistor device 20 is provided on the substrate 2. A hollow space is formed between the transistor device 20 and the airbridge 10 and extends in the direction perpendicular to the plane of the paper in FIG. 1. As shown in FIG. 1, the airbridge 10 has a dimension L and a height d. The dimension L is the distance between a pier portion 12a and a pier portion 12b of the airbridge 10, and the height d is the distance from the surface of the transistor device 20 to the portion of the inner surface of the airbridge 10 directly above the surface of the transistor device 20.

The inner surface of the airbridge 10 has a step-like configuration. Specifically, in accordance with the present embodiment, the inner surface of the airbridge 10 has two flights of steps ascending from the substrate 2. The higher steps have a smaller lateral dimension (which is parallel to the dimension L). Further, in the present embodiment, the higher steps also have a smaller vertical, or height, dimension, ensuring that the inner surface of the airbridge 10 has an approximately arched shape.

Figure 2:
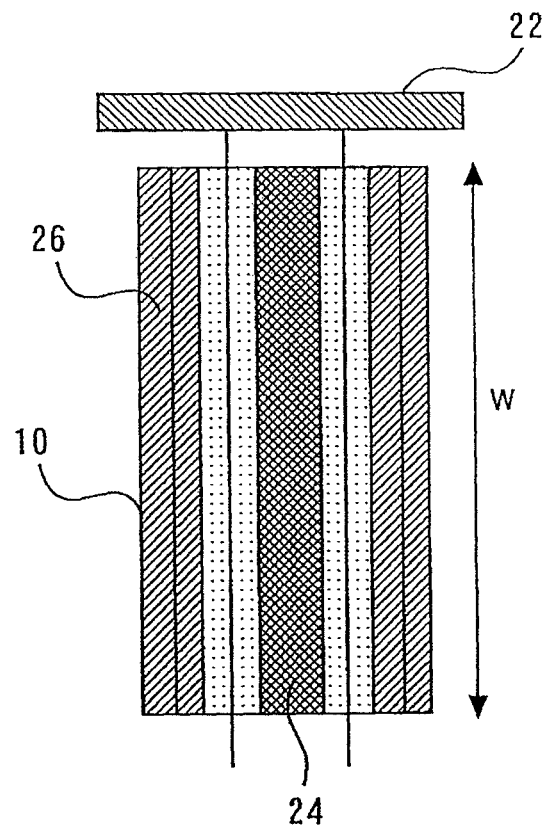
FIG. 2 is a plan view showing the construction of the airbridge in accordance with the first embodiment of the present invention.

FIG. 2 is a plan view showing the construction of the airbridge 10 of the first embodiment. Specifically, FIG. 2 is a view of the airbridge 10 as seen looking down from the top of FIG. 1. However, for convenience of illustration FIG. 2 also shows components (namely, a drain 24 and a source 26) covered by the airbridge 10.

FIG. 2 shows a detailed view of the transistor device 20, which is only schematically shown in FIG. 1. Referring to FIG. 2, the transistor device 20 has a gate 22, the drain 24, and the source 26, and the airbridge 10 entirely covers the drain 24 and the source 26. Thus, the airbridge 10 extensively covers the transistor device 20, thereby enhancing protection of the transistor device 20 from moisture.

As shown in FIG. 2, the airbridge 10 has a dimension W, which is the distance between the opposite arched edges of the airbridge 10 (i.e., the distance that the airbridge 10 extends in a direction perpendicular to the plane of the paper in FIG. 1). It should be noted that this dimension "W" is referred to herein as the "width" of the airbridge 10. Further, it should be noted that the dimension "L" shown in FIG. 1 is also referred to as the "length" of the airbridge.

The distance d (see FIG. 1) may be increased to reduce the capacitance between the transistor device 20 and the airbridge 20 and thereby improve the high frequency characteristics. For example, the capacitance when d is 12 μm is approximately 0.6 times that when d is 6 μm, with the wiring conductor thickness being 8 μm. This relation as to the capacitance value and the distance d was calculated from a formula derived as follows: Let it be assumed that a single wire has a radius of a, which corresponds to the case where the wiring conductor in an airbridge has a thickness of a. When this wire carries a charge Q per unit length, the number of electric flux lines emanating from the wire per unit length is Q/e, as dictated by Gauss' law, where e is permittivity in vacuum. This means that the electric flux line density at points spaced a distance r from the wire is Q/2pre. Accordingly, the electric field strength, E, at points spaced a distance r from the wire is represented by the equation: E=Q/2pre [V/m]. The following equation represents the potential difference between two points spaced distances r1 and r2, respectively, from the wire:

$$V_{r1} - V_{r2} = \int_{r2}^{r1} \left(-\frac{Q}{2\pi\varepsilon r}\right) dr = \frac{Q}{2\pi\varepsilon} \log\frac{r2}{r1}$$

Therefore, the capacitance, C, is represented by the equation: $C=2pe/(\log r2/r1)$. Note that 2pe is equal to 24.1. The value of the capacitance C obtained by substituting 8 µm for r1 and 20 µm for r2 in the equation is then divided by that obtained by substituting 8 µm for r1 and 14 µm for r2, giving a ratio of approximately 0.6.

The airbridge 10 has an approximately arched shape in cross-section, instead of an inverted rectangular U-shape. Such airbridges have great strength to resist vertical downward pressure applied to its top surface (i.e., pressure exerted from above the airbridge 10 in FIG. 1), as compared to airbridges having an inverted rectangular U-shape. The reason for this is that, for example, a vertical downward force applied to the top surface of the airbridge 10 (which has an approximately arched cross-sectional shape) is transmitted to the bridge ends as a compressive force. That is, some of the vertical downward force is distributed in lateral directions.

Further, the inner surface of the airbridge 10 has steps, which increases the total surface area of the airbridge 10. In this way the airbridge 10 has improved heat dissipation characteristics.

[Manufacturing Method of First Embodiment]

A method of manufacturing an airbridge in accordance with the first embodiment will be described with reference to FIGS. 3 to 9. The airbridge 10 may be manufactured by this method.

Figure 3:
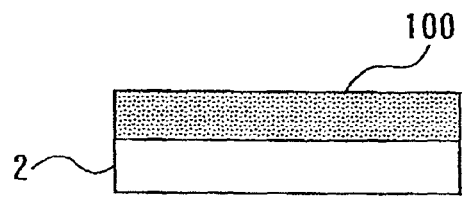
FIG. 3 is a diagram for explanation of a method of manufacturing an airbridge in accordance with the first embodiment.
Figure 4:
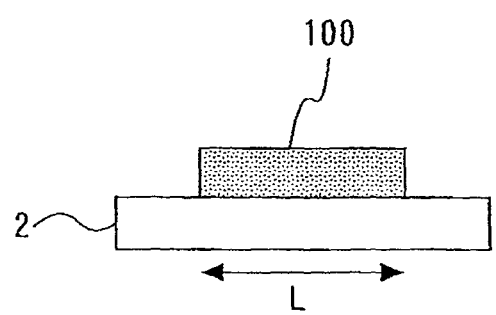
FIG. 4 is a diagram for explanation of a method of manufacturing an airbridge in accordance with the first embodiment.

This method begins by applying a first resist layer 100 over the substrate 2, as shown in FIG. 3. It should be noted that the transistor device 20 is omitted from FIG. 3 for simplicity. The thickness of this resist corresponds to the height of the pier portions 12a and 12b of the airbridge 10 formed later in the process.

Next, the resist layer 100 is exposed and developed to remove portions of the resist layer 100. Specifically, the exposure and development are achieved so that the remaining resist layer 100 on the substrate 2 covers the transistor device 20 which is to be located below the airbridge 10 and so that the remaining resist layer 100 has a width corresponding to the width of the airbridge 10 (i.e., the dimension W, see FIG. 2) and a length corresponding to the length of the airbridge 10 (i.e., the dimension L, see FIG. 1).

Especially in accordance with the first embodiment, the resist layer 100 is patterned to cover the entire active region of the transistor device 20 which is to be located below the airbridge. (More specifically, the resist layer 100 is patterned to cover the drain 24 and the source 26, as shown in FIG. 2).

Figure 5:
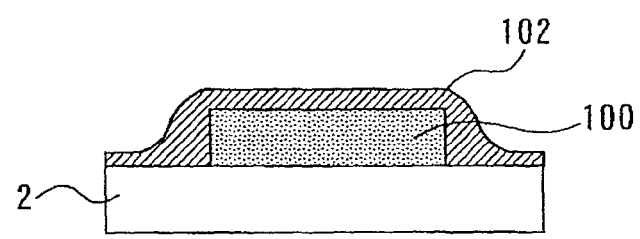
FIG. 5 is a diagram for explanation of a method of manufacturing an airbridge in accordance with the first embodiment.

Then as shown in FIG. 5, a second resist layer 102 is applied over the resist layer 100. It should be noted that in the first embodiment, the resist layer 102 has a thickness substantially thinner than (or half or less of) the thickness of the resist layer 100, as shown in FIG. 5.

Figure 6:
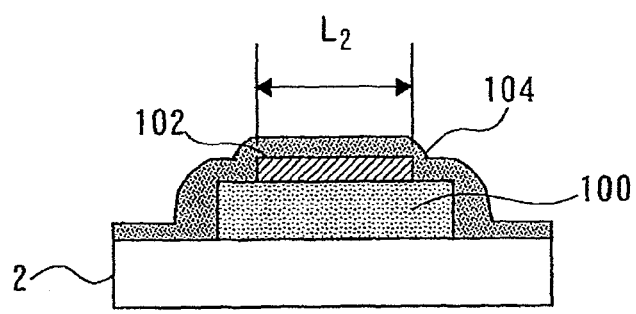
FIG. 6 is a diagram for explanation of a method of manufacturing an airbridge in accordance with the first embodiment.

Like the resist layer 100, the resist layer 102 is then exposed and developed to have a predetermined width, and then a third resist layer 104 is applied over the resist layer 102, as shown in FIG. 6. It should be noted that in the first embodiment, the resist layer 104 has a thickness slightly thinner than (or substantially equal to) the thickness of the resist layer 102.

In accordance with the first embodiment, the resist layer 102 on the resist layer 100 is exposed and developed so that the resist layer 102 has a length $L_2$ smaller than the length L of the resist layer 100 and so that the layer stack structure consisting of the resist layers 100 and 102 has a step-like cross-sectional shape taken along a plane parallel to the length of the airbridge. In accordance with the first embodiment, in this exposure and development process, the resist layer 102 is patterned so that the width of the resist layer 102 (which width corresponds to the dimension W of the airbridge 10) coincides with the width of a material layer 106 which is to be later formed and made into the airbridge 10 in the airbridge material layer forming process. After this patterning, the resist layer 104 is applied over the resist layer 102.

Figure 7:
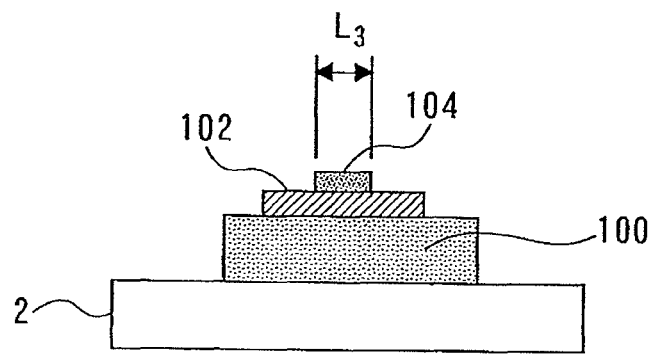
FIG. 7 is a diagram for explanation of a method of manufacturing an airbridge in accordance with the first embodiment.

The third resist layer 104 is then exposed and developed to have a predetermined dimension $L_3$, as shown in FIG. 7.

Figure 8:
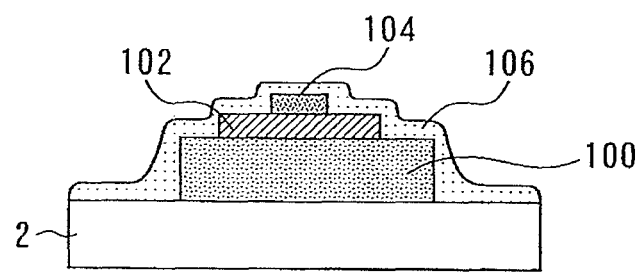
FIG. 8 is a diagram for explanation of a method of manufacturing an airbridge in accordance with the first embodiment.

Then as shown in FIG. 8, the airbridge-forming material layer 106 is formed over the layer stack structure consisting of the remaining resist layers 100, 102, and 104, thereby forming the airbridge 10. It should be noted that in the first embodiment, the layer 106 is formed by depositing and plating Au. In accordance with the first embodiment, in this process, the airbridge-forming material layer 106 is formed over the layer stack structure, which consists of the resist layers 100, 102, and 104 and has a step-like configuration, without heat treatment for thermally deforming the layer stack structure (i.e., without heat treatment to cause the steps of the structure to assume a curved configuration). Especially in the first embodiment, this process forms the layer 106 over the layer stack structure consisting of the resist layers 100, 102, and 104 so that the layer 106 has an area large enough to approximately cover the entire active region of the transistor device 20 and has a continuous surface without openings.

Figure 9:
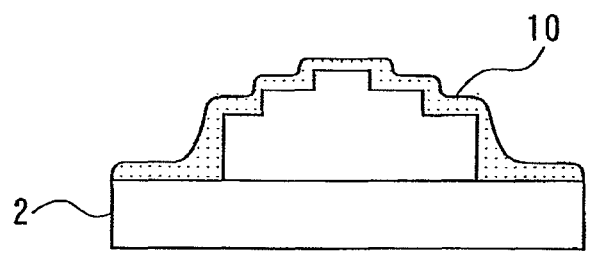
FIG. 9 is a diagram for explanation of a method of manufacturing an airbridge in accordance with the first embodiment.

The resist layers 100, 102, and 104 making up the layer stack structure are then removed, completing the manufacture of the airbridge 10, which has a step-like form in cross-section, as shown in FIG. 9. It will be noted that heat treatment is not performed in this resist removing process and the preceding processes described above.

It should be further noted that after this resist removing process, various semiconductor device manufacturing processes (including the final packaging process) are performed one after another.

The above airbridge manufacturing method of the first embodiment can be used to manufacture an airbridge 10 having a wide coverage area while preventing reduction of the strength of the airbridge 10 and degradation of the characteristics of the semiconductor element 20 and while avoiding the problem of resist material being left in the inner corners of the airbridge.

Further, in the airbridge manufacturing method of the first embodiment, a layer of airbridge forming material is formed over the layer stack structure consisting of the resist layers 100, 102, and 104 having a step-like configuration. Specifically, in accordance with the first embodiment, the lateral dimensions (L) and thicknesses (or heights) of the resist layers 100, 102, and 104 decrease as they are situated vertically further away from the substrate 2. This layer stack structure ensures that the airbridge 10 has an approximately arched shape in cross-section, instead of an inverted rectangular U-shape. Since the airbridge 10 has an approximately arched shape in cross-section, the hollow space under the airbridge 10 has a large cross-section, as compared to the case where the resist layers 102 and 104 are not used, making it easier to remove the resist material from between the airbridge 10 and the substrate 2. Further, since the airbridge 10 has an approximately arched shape instead of an inverted rectangular U-shape, it has greater strength and greater electrical capacity (that is, the more closely the airbridge 10 approximates arch shape, the greater its strength and electrical capacity). Thus in accordance with the first embodiment, the airbridge 10 has an increased strength and increased electrical capacity. Further, in the manufacture of the airbridge 10, the resist material between the airbridge 10 and the substrate can be easily removed. This makes it possible to increase the width dimension W of the airbridge 10 and thereby increase the substrate surface area covered by the airbridge 10. Further, the present embodiment prevents resist material from being left in the inner corners of the airbridge 10, resulting in increased yield of the airbridge 10 and the device containing the airbridge.

Further, the airbridge manufacturing method of the first embodiment does not include heat treatment for thermally deforming the resist, which treatment could otherwise cause a change in the characteristics of the transistor device 20 formed on the substrate. More specifically, the greater the width of the airbridge (i.e., the dimension W of the airbridge described in connection with the first embodiment), the greater the corresponding dimension of the resist layers (i.e., the resist layers 100, 102, and 104 of the first embodiment). It should be noted that a great amount of heat is required to thermally deform resist layers of large dimensions to the desired curved configuration, and such heat treatment may cause the characteristics of the semiconductor element to significantly deviate from the desired characteristics. With the airbridge manufacturing method of the first embodiment, on the other hand, there is no need for such heat treatment, avoiding degradation of the characteristics of the semiconductor element due to heat.

The above airbridge manufacturing method of the first embodiment can be used to manufacture an airbridge 10 having an approximately arched shape in cross-section (instead of an inverted rectangular U-shape) and hence having great strength. This eliminates the need for heat treatment for thermally deforming the resist, which treatment could otherwise cause a change in the characteristics of the transistor device 20. Further, it is possible to increase the area of the opening between the airbridge and the substrate, thereby avoiding resist material from being left in the airbridge. In addition to these advantages, the manufacturing method allows the airbridge 10 to have a great width (dimension W) and hence to have a wide coverage area.

Further, the airbridge manufacturing method of the first embodiment can be used to manufacture an airbridge having a wide coverage area and directly covering semiconductor elements (under the resist layer 100), in such a manner as to prevent changes in the characteristics of these devices due to heat.

Further, the airbridge manufacturing method of the first embodiment can be used to manufacture an airbridge 10 capable of continuously covering the entire transistor active region, while preventing reduction of the strength of the airbridge and degradation of the characteristics of the transistor device 20 and while avoiding the problem of resist material (originating from the resist layers 100, 102, and 104) being left in the inner corners of the airbridge. Continuously covering the entire transistor active region with an airbridge with no openings therein, such as the airbridge 10, enhances protection of the region from moisture.

It should be noted that the airbridge 10 may be incorporated in various high frequency semiconductor devices such as, e.g., MMICs. Examples of such devices include cellular phones (and base stations) using a wireless communications system, artificial satellites, radars (e.g., those for ships and aircraft), and various devices conforming to communications standards such as WiMAX (Worldwide Interoperability for Microwave Access), LTE (Long Term Evolution), and Bluetooth.

The following should be noted: the transistor device 20 of the first embodiment corresponds to one of the components to be located below the airbridge of the invention described in the Summary of the Invention section; the direction of the dimension W of the airbridge of first embodiment, the width direction of the airbridge of the invention (i.e., the direction in which the space under the airbridge extends); the direction of the dimension L, the length direction of the airbridge of the invention (i.e., the direction in which the airbridge extends over and straddles the components which are located on the substrate below the airbridge); the dimension L, the first length of the first spacer layer of the invention; and the dimension $L_2$, the second length of the second spacer layer of the invention.

[Advantages of First Embodiment, Comparative Examples]

Figure 13:
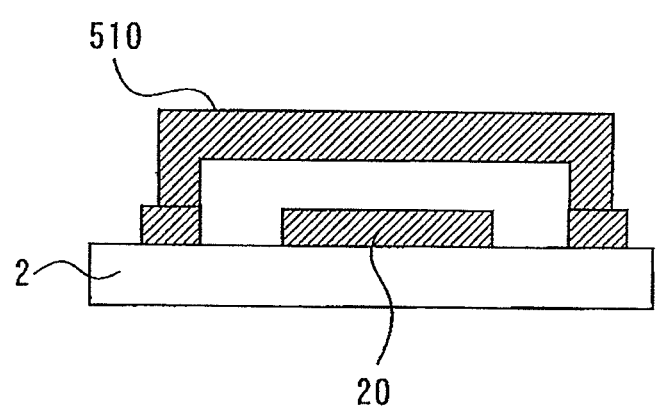
FIG. 13 is a diagram of comparative examples, and will be used to describe the advantages of the first embodiment.
Figure 14:
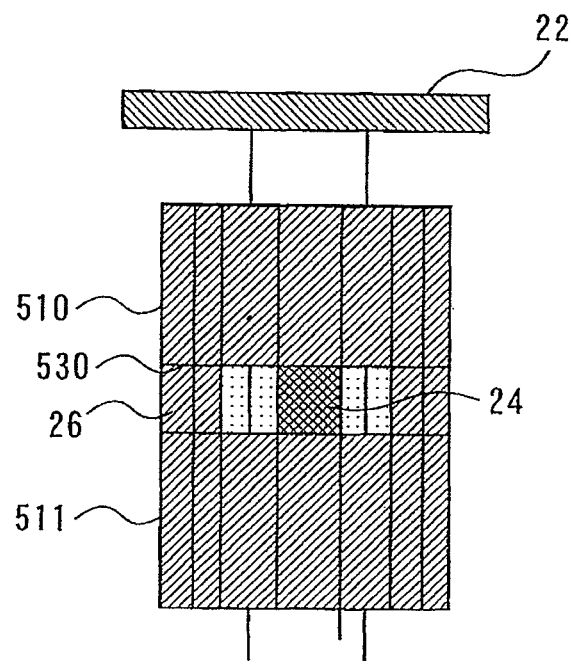
FIG. 14 is a diagram of comparative examples, and will be used to describe the advantages of the first embodiment.
Figure 15:
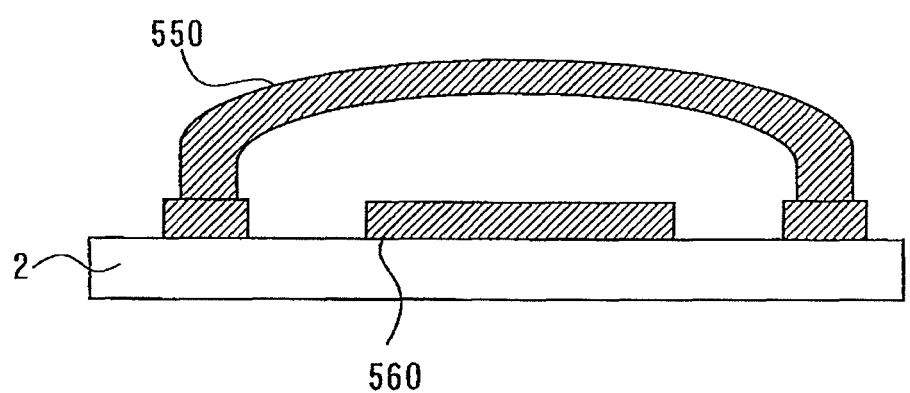
FIG. 15 is a diagram of comparative examples, and will be used to describe the advantages of the first embodiment.

FIGS. 13 to 15 are diagrams of comparative examples, and will be used to describe the advantages of the first embodiment. Specifically, FIG. 13 shows a rectangular airbridge 510. Since the airbridge 510 has an inverted rectangular U-shape as shown in FIG. 13, a vertical downward force applied to its top surface causes a bending moment (warp) at the center portion of the body of the airbridge and acts as a shear force. On the other hand since the airbridge 10 has an approximately arched cross-sectional shape, a vertical downward force applied to its top surface is transmitted to the bridge ends as a compressive force, that is, some of the vertical downward force is distributed in lateral directions.

FIG. 14 is a diagram showing an airbridge including two separate smaller airbridges 510 and 512. As described in connection with the first embodiment, the manufacturing process of a rectangular airbridge having a great depth (corresponding to the dimension W in FIG. 2) suffers from the fact that resist material is likely to be left in the corners of the airbridge. The airbridge construction shown in FIG. 14 avoids this problem, since it is made up of the separate airbridges 510 and 512 having a small depth (corresponding to the dimension W in FIG. 2) arranged in a side-by-side fashion. However, although the entire airbridge shown in FIG. 14 (including the smaller airbridges 510 and 512) has a great depth, or width, it has a disadvantage over the airbridge 10. Specifically, in the construction shown in FIG. 14, an opening 530 is formed between the airbridges 510 and 512, and components on the substrate are exposed through this opening 530. That is, the transistor region (including the drain 24 and the source 26) is exposed through this opening 530, thus degrading the protection of the transistor region from moisture. The airbridge 10 of the first embodiment, on the other hand, has the large dimension W and continuously covers the underlying components, thereby providing high moisture resistance to these components.

FIG. 15 shows an airbridge 550 having curved surfaces. Such airbridges are described in Japanese Laid-Open Patent Publication Nos. H10-065006 and 2008-270617. In the manufacture of these airbridges (which have a curved cross-sectional shape), first a resist is applied to the substrate and then heated (at a predetermined temperature, e.g., not more than 300° C.) to deform the resist to the desired curved or semispherical configuration, etc., which resist is used to form an airbridge having a curved configuration. In this case, however, the heat treatment may adversely affect the transistor characteristics. On the other hand, the airbridge manufacturing method of the first embodiment does not includes heat treatment, thereby avoiding the degradation of the transistor characteristics due to heat.

[Variations of First Embodiment]

In accordance with the first embodiment, the airbridge 10 is formed to straddle the transistor device 20. However, the present invention is not limited to this particular airbridge structure. The transistor device 20 of the first embodiment may be replaced by various components other than field effect transistors (FETs). Specifically, in accordance with the present invention, a component to be located below the airbridge 10 may be one of various type of semiconductor active devices such as transistors (other than FETs) and diodes, or may be a passive device or a wiring conductor. Such a passive device may be part of an MIM (Metal Insulation Metal) capacitor when the airbridge is connected between that MIM capacitor and a wiring conductor. When a component to be located below the airbridge 10 is a wiring conductor, it may extend on the surface of the substrate 2 directly under the pier portions 12a and 12b.

The semiconductor active device to be located below the airbridge 10 may be a heterojunction bipolar transistor (hereinafter referred to simply as HBT).

An HBT has tree terminals, namely, an emitter electrode, a base electrode, and a collector electrode. For example, AuGe/Ni/Au is used as collector electrode material for InP-based HBTs. This electrode material is applied, e.g., to the InP semiconductor of a semiconductor active device (HBT) and they are heat treated so that their contact is made intimate and exhibits ohmic characteristics (i.e., exhibits a relatively low resistance). As a result of this, a current flows in the semiconductor active device when a voltage is applied to the electrode.

However, if the duration of the heat treatment is too long or the temperature is too high, on the other hand, the contact will be made "too intimate," resulting in degradation of the characteristics of the semiconductor active device (e.g., the device being unable to have a sufficiently high gain). That is, excessive heat treatment and excessive temperature could degrade the reliability of the semiconductor active device.

Therefore, in the case where the manufacturing process of an InP-based HBT includes forming an airbridge using heat treatment after forming the collector electrode of the HBT, that heat treatment might cause some degree of degradation of the characteristics of the HBT, since the optimum ohmic characteristics of the HBT are achieved by the completion of the collector electrode-forming process and no further heat treatment is required. On the other hand, the present embodiment allows the manufacture of an airbridge having a wide coverage area while avoiding degradation of the ohmic characteristics.

In accordance with the first embodiment, the airbridge 10 is formed to directly straddle the semiconductor element. However, the present invention is not limited to this particular arrangement. The semiconductor element may not be located below the airbridge 10, but may be located around the airbridge 10. Even in this case if the airbridge is manufactured using heat treatment, that heat treatment might cause a change in the characteristics of the semiconductor element. Therefore, the airbridge manufacturing method of the first embodiment is also advantageous in this case, since it does not include heat treatment.

In accordance with the first embodiment, the dimension W of the airbridge 10 is such that the airbridge entirely covers the drain 24, etc. The dimensions of the active layer (or active region), etc. of the semiconductor active device vary depending on the design of the device. In accordance with the first embodiment, when the width of the transistor active layer (corresponding to the dimension W of the airbridge 10) is 300 μm, the dimension W of the airbridge 10 is 320 μm so that the airbridge covers the transistor active layer. However, the present invention is not limited to these dimensions. Since the airbridge manufacturing method of the first embodiment is designed to prevent resist material from being left in the corners of the airbridge, the dimension W of the airbridge can be larger than the corresponding dimension of rectangular airbridges (i.e., the dimensional restriction is less severe). This means that the dimension W of the airbridge 10 can be increased regardless of whether the airbridge 10 completely covers the underlying components.

The airbridge manufacturing method of the first embodiment is suitable for forming an airbridge for a semiconductor element whose electrical characteristics have been already adjusted through heat treatment. The reason for this is that the method allows the manufacture of the airbridge 10 of the first embodiment, which has a wide coverage area, without causing a change in the optimized characteristics of the semiconductor element. More specifically, the airbridge manufacturing method of the first embodiment is suitable for forming an airbridge for a semiconductor active device including a transistor having a collector electrode after the electrical characteristics of the collector electrode and the semiconductor material of the transistor have been adjusted through heat treatment. This is because the method is designed to avoid a change in the electrical characteristics between the collector electrode and the semiconductor material after these characteristics have been optimized through heat treatment.

The airbridge manufacturing method of the first embodiment is suitable for use when the temperature at which the resist layers 100, 102, and 104 begin to deform on heating is higher than the temperature at which the characteristics of the semiconductor element begin to deviate from their specified ranges (or design ranges) when the semiconductor element is heated.

For example, in the manufacture of an airbridge structure having a curved cross-section as described in Japanese Laid-Open Patent Publication Nos. H10-065006 and 2008-270617, first a resist is applied to the substrate and then heated (at a predetermined temperature, e.g., not more than 300° C.) to deform the resist to the desired curved or semispherical configuration, etc., which resist is subsequently used to form the curved airbridge.

Regarding the resist (or spacer material) used to manufacture an airbridge, naturally there are fewer choices of materials when the resist is to be thermally deformed than when it is not. Therefore, the airbridge manufacturing method of the first embodiment is designed to manufacture an airbridge having the desired configuration without heat treatment for thermally deforming the resist, meaning that there are many choices of materials for the resist, or spacer.

The airbridge 10 of the first embodiment is formed using a layer stack resist structure which serves as a spacer and which includes three layers, namely, the resist layers 100, 102, and 104. Further, the airbridge 10 is symmetrical about the vertical center line as viewed in FIG. 1. However, the present invention is not limited to this particular airbridge construction. For example, the spacer may be a two-layer-stack resist structure, or a layer stack resist structure having four or more layers. Further, while in the first embodiment the higher resist layers are thinner, other embodiments may not include this feature. Further, the airbridge 10 may not be symmetrical, and the left and right pier portions may have different height dimensions. Specifically, for example, the airbridge 10 may be used to connect an MIM capacitor to a wiring conductor. In this case, an MIM capacitor structure having a predetermined thickness may be formed between the substrate 2 and one of the pier portions of the airbridge 10 (e.g., the pier portion 12b) so that the pier portion 12b is disposed on the metal layer of the surface of this MIM capacitor. This means that the height dimension of the pier portion 12b is smaller than that of the pier portion 12a by an amount corresponding to the thickness of the MIM capacitor.

Although in the first embodiment a photoresist is used as spacer material to form an airbridge, it is to be understood that the present invention is not limited to this particular spacer material. The photoresist serving as the spacer material may be replaced by any material having the properties required by the spacer of the first embodiment. One of the required properties is that the spacer material be removable after a layer of airbridge material (in the first embodiment gold) is formed thereon.

Second Embodiment

Figure 10:
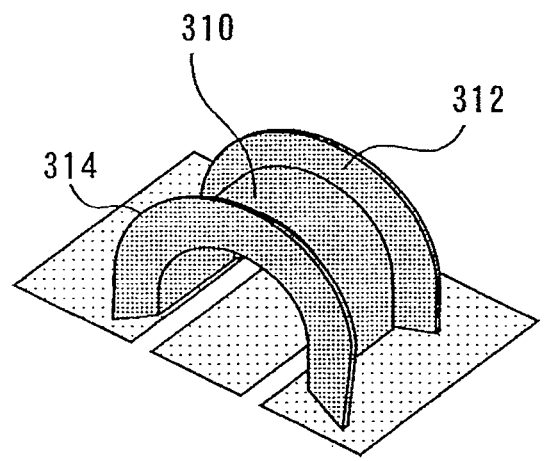
FIG. 10 is a diagram showing the construction of an airbridge in accordance with a second embodiment of the present invention.

FIG. 10 is a schematic diagram illustrating a method of manufacturing an airbridge in accordance with a second embodiment of the present invention. The airbridge, 310, of the second embodiment is similar in construction to the airbridge 10 of the first embodiment, except that it includes flange or rim portions 312 and 314. It should be noted that the steps on the inner surface of the airbridge 310 are omitted from FIG. 10 for convenience of illustration. Further, FIG. 10 does not specifically show the components below the airbridge 310; they are similar to those disposed below the airbridge of the first embodiment or the variation thereof.

The flange portions 312 and 314 form the opposite arched edge portions of the airbridge 310, respectively, so as to increase the area of the opening between the airbridge and the substrate. These flange portions 312 and 314 serve to enhance the strength of the airbridge 310, as well as to guide the flow of resist-removing material to below the airbridge 310 in the resist removing process.

Although only schematically shown in FIG. 10, it will be appreciated that the flange portions 312 and 314 extend outwardly from the body of the airbridge 310 at a predetermined angle with respect to the width direction of the airbridge 310. This angle may be determined by process requirements, etc. For example, this angle may be 45-60°.

The flange portions 312 and 314 may be formed by the following steps. First, for example, at least one of the two arched lengthwise edge portions of the layer stack structure of the first embodiment (including the resist layers 100, 102, and 104) is made wider and/or higher than the central portion between these lengthwise edge portions, wherein the length of the layer stack structure being perpendicular to the dimension W of the structure (or airbridge). That is, additional resist layers may be formed on these edge portions, or alternatively, the central portion of the layer stack structure of the first embodiment consisting of the resist layers 100, 102, and 104 may be reduced to smaller dimensions. Next, a layer of airbridge-forming material (e.g., gold) is formed over this layer stack structure. A resist removing process is then performed to remove the layer stack resist structure. At that time, the substrate 2 (wafer) is preferably shaken, or reciprocated, in the depth, or width, direction of the airbridge 310. The flange portions formed by this manufacturing method actually do not have a smooth curved configuration as shown in FIG. 10, but have an outwardly widening configuration including a plurality of steps.

Alternatively, each of the arched edge portions of the layer stack resist structure may be shaped to have an outwardly gradually widening smooth surface, thus producing flange portions more similar in configuration to those shown in FIG. 10.

It should be further noted that although in the second embodiment the airbridge 310 has the flange portions 312 and 314 on its opposite arched edges, respectively, the present invention is not limited to this particular construction. In other embodiments, the airbridge 310 may have only one of these flange portions 312 and 314.

Third Embodiment

Figure 11:
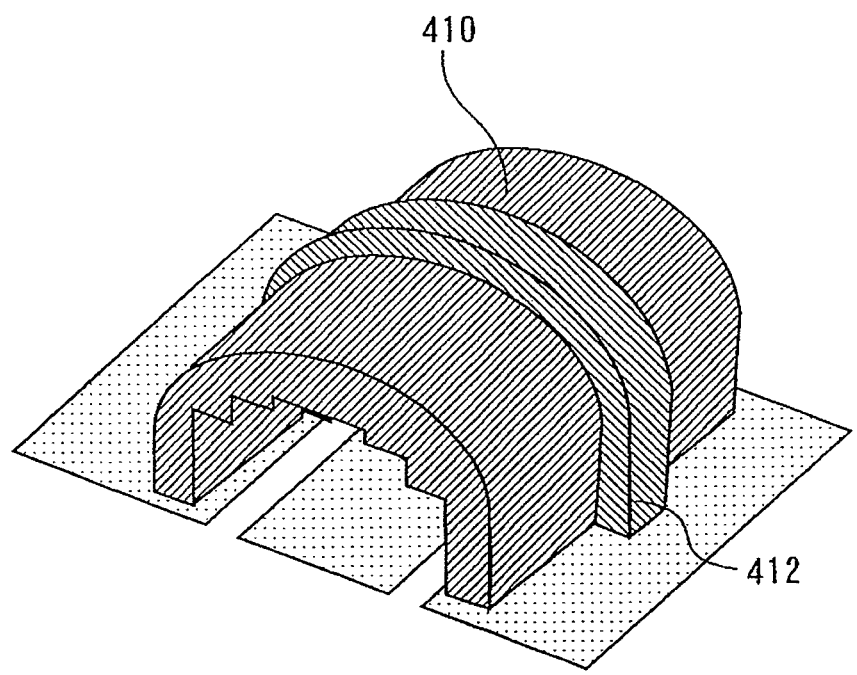
FIG. 11 is a diagram showing the construction of an airbridge in accordance with a third embodiment of the present invention.
Figure 12:
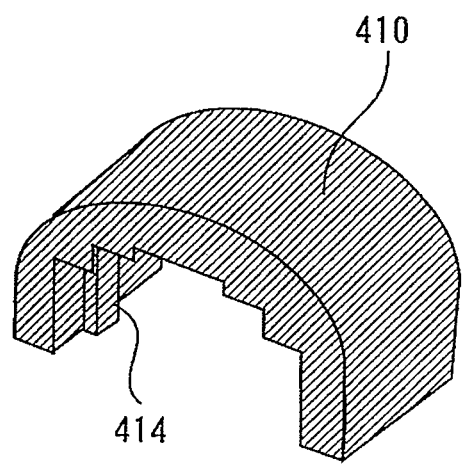
FIG. 12 is a diagram showing the construction of an airbridge in accordance with a third embodiment of the present invention.

FIGS. 11 and 12 are diagrams illustrating the constructions of airbridges in accordance with a third embodiment of the present invention. Specifically, the airbridge 410 of the third embodiment shown in FIG. 11 is similar in construction to the airbridge 10, except that it is provided with a rib 412 on its outer surface. Further, FIG. 12 shows a variation of the airbridge 410. This airbridge, unlike that shown in FIG. 11, has a rib 414 on its inner surface. The ribs 412 and 414 shown in FIGS. 11 and 12, respectively, serve to enhance the strength of the airbridge 410.

The airbridge 410 provided with the rib 412 may be manufactured by the following procedure. First, an airbridge is manufactured by the manufacturing method of the first embodiment. Next, a resist is applied over the airbridge and then removed from the area where the rib is to be formed. The rib is then formed on this airbridge by deposition, etc., and the remaining resist is eventually removed. On the other hand, the airbridge 410 provided with the rib 414 may be manufactured by the following procedure. For example, first, a resist (serving as a spacer) is formed and then removed (by exposure and development or by a mechanical method) from the region where the rib is to be formed. The airbridge is then formed over the remaining resist.

The above second embodiment encompasses, in addition to the invention described in connection with the first embodiment, the technical idea of adding flange portions to an airbridge. This technical idea may be implemented independently of the airbridge construction of the first embodiment. Specifically, the flange portions 312 and 314 may be formed on any conventional or otherwise suitable airbridge other than that described in connection with the first embodiment.

Further, the third embodiment also encompasses, in addition to the airbridge manufacturing method of the first embodiment, the technical idea of adding a rib to an airbridge. This technical idea may also be implemented independently of the airbridge construction of the first embodiment. Specifically, the rib 412 or 414 may be formed on any conventional or otherwise suitable airbridge other than that described in connection with the first embodiment.

Obviously many modifications and variations of the present invention are possible in the light of the above teachings. It is therefore to be understood that within the scope of the appended claims the invention may by practiced otherwise than as specifically described.

The entire disclosure of a Japanese Patent Application No. 2010-232129, filed on Oct. 15, 2010 including specification, claims, drawings and summary, on which the Convention priority of the present application is based, are incorporated herein by reference in its entirety.

What is claimed is:

1. A method of manufacturing an airbridge, comprising:
   forming a first spacer layer on a substrate including a semiconductor element so that the first spacer layer covers a component to be located below the airbridge, the first spacer layer having a width extending in a width direction of the airbridge and a first length extending in a length direction of the airbridge, the width direction being a direction in which space under the airbridge extends, the length direction being a direction in which the airbridge extends over and straddles the component to be located on the substrate, below the airbridge;
   forming a second spacer layer on the first spacer layer so that the first and second spacer layers are a layer stack structure having a stepped shape, in a cross section taken in a plane perpendicular to the width direction of the airbridge, the second spacer layer having a second length in the length direction of the airbridge, the second length being shorter than the first length of the first spacer layer, wherein
   the second spacer layer includes a plurality of layers, and dimensions of the plurality of layers of the second spacer layer, in the length direction, and thicknesses of the plurality of layers of the second spacer layer, decrease with distance from the first spacer layer;

forming a material layer over the layer stack structure, without any heat treatment that deforms the layer stack structure, the material layer forming the airbridge; and after the forming of the material layer, removing the layer stack structure.

2. The method according to claim 1, wherein the component to be located below the airbridge includes the semiconductor element.

3. The method according to claim 1, including adjusting electrical characteristics of the semiconductor element by heat treatment before manufacturing the airbridge.

4. The method according to claim 1, wherein the semiconductor element includes a transistor having a collector electrode, and including adjusting electrical characteristics between the collector electrode and the semiconductor material of the transistor by heat treatment when forming the semiconductor element.

5. The method according to claim 4, wherein:
the transistor is an InP-based heterojunction bipolar transistor; and
the electrical characteristics are ohmic contact characteristics between the collector electrode and the semiconductor material.

6. The method according to claim 1, wherein the temperature at which the first and second spacer layers begin to deform is higher than the temperature at which the electrical characteristics of the semiconductor element begin to deviate from design ranges when the semiconductor element is heated.

7. The method according to claim 1, wherein:
the component to be located below the airbridge includes the semiconductor element;
the first spacer layer covers all of an active region of the semiconductor element;
the second spacer layer, in the length direction of the airbridge, is smaller than the first spacer layer in the length direction of the airbridge;
in forming the airbridge material layer, either the second spacer layer in the width direction of the airbridge coincides dimensionally with the airbridge-forming material layer in the width direction of the airbridge, or the second spacer layer extends outwardly beyond the airbridge-forming material layer in the width direction of the airbridge; and
the airbridge-forming material layer has an area large enough to approximately cover all of the active region, has a continuous surface without openings, and is located on the layer stack structure consisting of the first and second spacer layers.

8. The method according to claim 1, wherein forming the airbridge material layer includes forming a flange portion on at least one edge of the layer stack structure, consisting of the first and second spacer layers, to increase area of the opening under the at least one edge of the airbridge, the at least one edge extending perpendicular to the width direction of the airbridge.

9. The method according to claim 8, wherein forming the flange portion includes:
either forming a third spacer layer on at least one edge of the layer stack structure consisting of the first and second spacer layers, or reducing a central portion of the layer stack structure to a smaller dimension, so that the at least one edge of the layer stack structure is wider and/or higher than the central portion of the layer stack structure, the at least one edge extending perpendicular to the width direction of the airbridge, the central portion being located at the center of the width of the layer stack structure; and
forming the airbridge-forming material layer over the layer stack structure after forming the third spacer layer or reducing the central portion of the layer stack structure.

10. The method according to claim 8, wherein forming the flange portion includes forming a flange portion on each of two opposite edges of the layer stack structure consisting of the first and second spacer layers to increase the area of the opening under each of the two opposite edges of the airbridge, the two opposite edges extending perpendicular to the width direction of the airbridge.

11. The method according to claim 8, wherein removing the spacer includes:
supplying a removing agent to the layer stack structure consisting of the first and second spacer layers, the removing agent removing the first and second spacer layers; and
moving the substrate on which the airbridge is to be formed in the depth direction of the airbridge, while supplying the removing agent.

12. The method according to claim 1, wherein the material of the first and second spacer layers is photoresist.

13. The method according to claim 1, further comprising forming a rib on a pier portion of the airbridge.

14. A method of manufacturing a semiconductor device, comprising manufacturing an airbridge in accordance with the method of claim 1.

15. The method according to claim 1 including removing only parts of the first and second spacer layers to form a groove so that when the air bridge-forming material layer is formed over the layer stack structure, the air bridge includes an internal rib of the air bridge-forming material layer deposited in the groove.

* * * * *